United States Patent
Kim et al.

(10) Patent No.: US 7,580,318 B2
(45) Date of Patent: Aug. 25, 2009

(54) ADDRESS BUFFER CIRCUIT AND METHOD FOR CONTROLLING THE SAME

(75) Inventors: Sung-Hoon Kim, Seongnam-si (KR); Joung-Yeal Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 484 days.

(21) Appl. No.: 11/232,175

(22) Filed: Sep. 21, 2005

(65) Prior Publication Data

US 2006/0077748 A1     Apr. 13, 2006

(30) Foreign Application Priority Data

Oct. 13, 2004    (KR)             10-2004-0081561

(51) Int. Cl.
*G11C 8/06*        (2006.01)
*G11C 5/14*        (2006.01)

(52) U.S. Cl. ................. 365/230.08; 365/195; 365/227

(58) Field of Classification Search ........... 365/189.05, 365/230.08, 194, 193, 195, 227
See application file for complete search history.

(56) References Cited

U.S. PATENT DOCUMENTS

| | | | | |
|---|---|---|---|---|
| 4,385,369 A | * | 5/1983 | Sheppard | .................... 365/227 |
| 4,787,067 A | * | 11/1988 | Takemae et al. | ............. 365/222 |
| 5,124,584 A | * | 6/1992 | McClure | ...................... 326/93 |
| 5,384,745 A | * | 1/1995 | Konishi et al. | ......... 365/230.03 |
| 6,295,245 B1 | * | 9/2001 | Tomita et al. | .......... 365/189.16 |
| 6,363,031 B2 | | 3/2002 | Phelan | ........................ 365/233 |
| 6,430,092 B2 | * | 8/2002 | Nanba | ................... 365/189.11 |
| 6,519,188 B2 | | 2/2003 | Ryoo et al. | ............. 365/189.05 |

\* cited by examiner

*Primary Examiner*—Jung (John) H. Hur
(74) *Attorney, Agent, or Firm*—F. Chau & Associates, LLC

(57) ABSTRACT

An address buffer circuit for a semiconductor memory device wherein an address buffer is enabled (to output an internal address signal) in response to a first level of a control signal and, but is disabled in response to a second level of the control signal. An address buffer control unit generates the control signal at the second level in 'no operation' state (NOP command) in which the semiconductor memory device does not perform data accessing operations and generates the control signal at the first level while the semiconductor memory device performs data accessing operations, thereby reducing or minimizing the output of an internal address buffered and output by the address buffer at and thus reducing power consumption during no-operation states of the semiconductor memory device.

18 Claims, 6 Drawing Sheets

ADDRESS BUFFER CIRCUIT AND METHOD FOR CONTROLLING THE SAME

CROSS-REFERENCE TO RELATED APPLICATION

This application claims the priority under 35 USC § 119 of Korean Patent Application No. 2004-10-0081561, filed Oct. 13, 2004, which is incorporated herein by reference in its entirety.

BACKGROUND OF THE INVENTION

1. Technical Field

The present invention relates to semiconductor memory devices, and more particularly, to address buffers for semiconductor memory devices.

2. Discussion of the Related Art

Memory chip designers and users seek semiconductor memory chips capable of satisfying high density integration, high-speed operation, and low power consumption.

Generally, transistor-transistor logic (TTL) or complementary metal oxide semiconductor (CMOS) technologies have been used for chips that communicate data with dynamic random access memories (DRAMs). TTL has a noise margin narrower than that of CMOS. In particular, DRAMs connected to such chips are required to withstand variations of power supply voltage, temperature changes and the like and to perform stable operation despite noise. DRAMs are designed with the assumption that an external input signal is at a TTL level. A buffer connected to an address pin is called an address input buffer or an address buffer. Address buffers convert the external TTL signal to a CMOS signal used in the DRAM. The Address Buffer is typically used to buffer (e.g., invert) the column and row addresses that are sent via the address bus. Address selection is performed in two phases, first the row is selected, then the column.

An address input to the address buffer is called an external address, and a converted output from the address buffer is called an internal address. The internal address is input to a decoder to select a word line of memory cells having data stored therein.

A conventional address buffer circuit for buffering an external address and outputting an internal address as a buffered result signal will be described with reference to FIGS. 1 and 2.

FIG. 1 is a schematic block diagram of a conventional address buffer device.

Referring to FIG. 1, in the address buffer 1, there is an external address signal (ext.an) indicating an address input to the address buffer 1, an internal address signal (int.an) that is a buffered version of the external address signal (ext.an), and a memory control signal (con.sig) synchronized by a clock.

When the external address signal (ext.an) is input to the address buffer 1, the address buffer 1 outputs the internal address signal (int.an) as a buffered signal.

The memory control signals (con.sig) are signals that are combined to produce a command for controlling the operation of a semiconductor memory device. That is, the memory control signals (con.sig) are signals for accessing memory cells in the semiconductor memory device through their logical combination. Generally, the memory control signals include a row address strobe, a column address strobe, a write enable signal and the like.

In address multiplexing (mainly used in DRAMs), the address is broken up into two pieces, a row address (most significant digits of address, e.g., 10 bits) and a column address (least significant digits of address, e.g., 12 bits). The address is strobed over in these two components. (This saves expensive external pins since fewer (e.g., 12) address lines are needed (e.g., instead of 22.) To distinguish between the column and the write address, the CAS* and RAS* (column address strobe and row address strobe) signals are used.

Thus, in address multiplexing, an address is input and controlled by a row address strobe (RAS) and a column address strobe (CAS). (Hereinafter, for convenience of illustration, it is assumed that the row address strobe and the column address strobe indicate that are inverted signals, RASB and CASB respectively). In particular, to shorten an access time, the column address in DRAMs is not under direct control of the column address strobe and, instead, the column address responds to a signal indicating that input of a row address is completed by the row address strobe. Memory control signals (con.sig), such as the row address strobe, the column address strobe, write enable signal (WE) and the like, cause standby, power down, refresh and the like to occur in memory cells of the semiconductor memory device. (For convenience of illustration, it is assumed that the write enable signal is an inverted signal, WEB.) At this time, even though the memory control signals (con.sig) are logically combined to produce a command for controlling the operation of the semiconductor memory device, there exists a state where no operation occurs in the memory cells. This is called the 'no operation' command (NOP).

The 'NO OPERATION' command (NOP) prevents unwanted commands from being registered during idle or wait states (e.g., when CS is unselected). For example, when the row address strobe and the column address strobe have a logic value of '1', the memory device enters 'no operation' command.

This 'no operation' command is generally specified in a specification of a semiconductor memory device.

In the 'no operation' command, there is no operation occurring in the memory device, but the internal address signal (int.an) continues to be output. This results in power consumption due to current flowing through the address buffer 1.

Further, the internal address signal (int.an), which is buffered and output in the address buffer 1, is input to all chips, resulting in increased power consumption.

To reduce power consumption in the semiconductor memory device, a method has been used that performs a separate logical operation at a subsequent stage of the address buffer 1, allowing a buffered signal from the address buffer 1 to be selected by a chip select signal.

FIG. 2 is a schematic diagram of an address buffer circuit in which NAND operation is performed on a chip select signal and a buffered signal from an address buffer in FIG. 1, allowing the buffered signal from the address buffer to be selected by a chip select signal.

Referring to FIG. 2, a NAND gate 2 for performing NAND operation with a chip select signal (cs) is connected to a subsequent stage of an address buffer in FIG. 1.

A process will be described which inputs and buffers an external address signal (ext.an) from an address pin (not shown) to the address buffer 11, and then, outputs an internal address signal (int.an).

An external address signal (ext.an) is first input to the address buffer 11. The NAND gate 2 performs NAND operation on the buffered signal (m.an) from the address buffer 11 and on a chip select signal (cs). A result of the NAND operation is an internal address signal (int.an). To select one desired word line, the internal address signal (int.an) is pre-decoded prior to being input to a decoder (not shown).

For example, when a logic value of the chip select signal (cs) is '0', the output of the NAND gate 2 becomes '1' whether a logic value of an output signal (m.an) from the address buffer 11 is '1' or '0'. Accordingly, the internal address (int.an) becomes '1'. That is, by inputting the chip select signal (cs) at '0', it is possible to control the output signal from the address buffer 11. The logic value '0' is indicated when the voltage level is low and the logic value '1' is indicated when the voltage level is high. No current flows through a non-selected chip, reducing power consumption.

In the above-described case, however, power consumption in the address buffer is not reduced since the address buffer 11 is not under direct control. Thus, there is a limitation in using a chip select signal (cs) at a subsequent stage of the address buffer to reduce power consumption.

Further, in the 'no operation' state (NOP command) in which no command based on memory control signals is provided to memory cells of the semiconductor memory device, the address buffer still buffers and outputs the internal address signal. Thus, unnecessary current still flows, increasing power consumption in the semiconductor memory device.

SUMMARY OF THE INVENTION

An embodiment of the invention provides a (gated) address buffer and a method for controlling the same, which are capable of reducing power consumption by disabling the address buffer during no-operation states of a semiconductor memory device.

Another embodiment of the invention provides an address buffer circuit and a method for controlling the same, which are capable of reducing or minimizing power consumption in a semiconductor memory device by reducing a signal buffered and output by an address buffer during a 'no operation' state (NOP command) in which memory cells are not accessed. Standard memory control signals are logically combined to generate a control signal for enabling and disabling the address buffer.

Exemplary embodiments of the present invention provide an address buffer circuit for a semiconductor memory device, comprising: an address buffer adapted to receive and buffer an external address signal (and outputting an internal address signal) in response to a first level of an control signal, the operation of the address buffer being disabled in response to a second level of the control signal; and an address buffer control unit for generating the control signal at the second level in 'no operation' state (NOP command), for example by logically combining a row address strobe (RASB), a column address strobe (CASB), and a write enable signal (WEB) of memory control signals to generate a control signal for controlling the operation of the address buffer.

The address buffer control unit may generate the control signal at the second level when a chip select signal (CSB) of the memory control signals is at a high level.

In accordance with another exemplary embodiment, there is provided an address buffer circuit for a semiconductor memory device, comprising: an address buffer for receiving and buffering an external address signal (and outputting an internal address signal) in response to a first level of a control signal, the operation of the address buffer being disabled in response to a second level of the control signal; an address buffer control unit for generating the control signal at the second level in a 'no operation' state (NOP command). A delay unit connected to a previous stage of the address buffer for allows the external address signal to be input to the address buffer at the same time that the control signal is generated at the first level.

The delay unit may be connected between a controller for controlling the operation of the address buffer and the address buffer.

Alternatively, the delay unit may be provided on an external address signal line or a signal line from the address buffer in the semiconductor memory device.

The control signal at the first level and the control signal at the second level may be generated as logical combination of a chip select signal (CSB), the row address strobe (RASB), the column address strobe (CASB), and the write enable signal (WEB).

Preferably, the address buffer control unit may generate the control signal at the second level when a chip select signal (CSB) of the memory control signals is at a high level.

Preferably, the delay unit may allow the external address signal to be input to the address buffer later than or concurrently with the control signal being generated at the first level.

In another exemplary embodiment, there is provided a method for controlling an address buffer, comprising: providing a control signal having a first level to the address buffer so that the address buffer receives an external address signal and outputs an internal address signal; providing the control signal at a second level to the address buffer so that the address buffer is disabled. Further, delaying the external address signal so that the external address signal is input to the address buffer at the same time point that the control signal at the first level is generated.

Preferably, the control signal at the first level and the control signal at the second level may be generated using memory control signals logically combined to generate a command for controlling the operation of the semiconductor memory device.

Preferably, the memory control signals to be combined comprise at least two of a chip select signal (CSB), a row address strobe (RASB), a column address strobe (CASB), and a write enable signal (WEB).

Preferably, the control signal at the second level may be generated when the chip select signal (CSB) is at a high level; or when the row address strobe (RASB), the column address strobe (CASB) and the write enable signal (WEB) are all at a high level.

BRIEF DESCRIPTION OF THE DRAWINGS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention. The above and other features of the present invention will become more apparent to those of ordinary skill in the art by describing in detail preferred embodiments thereof with reference to the attached drawings in which like numbers refer to like elements, and.

DETAILED DESCRIPTION OF EXEMPLARY EMBODIMENTS OF THE INVENTION

Figure 1:
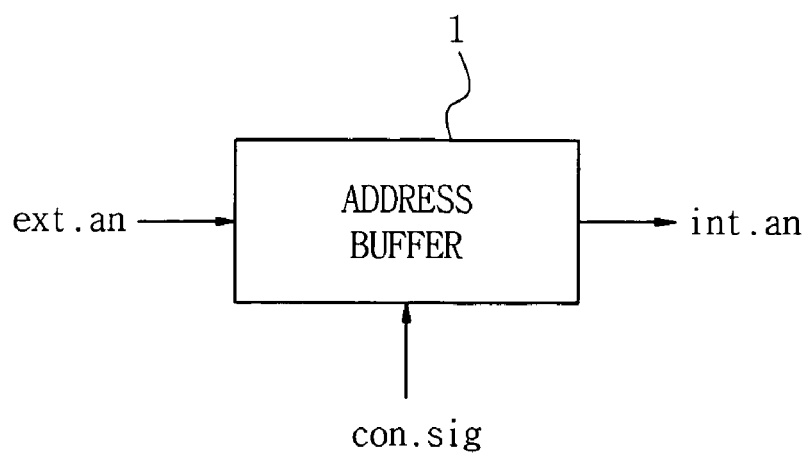
FIG. 1 is a schematic block diagram of a conventional address buffer.
Figure 2:
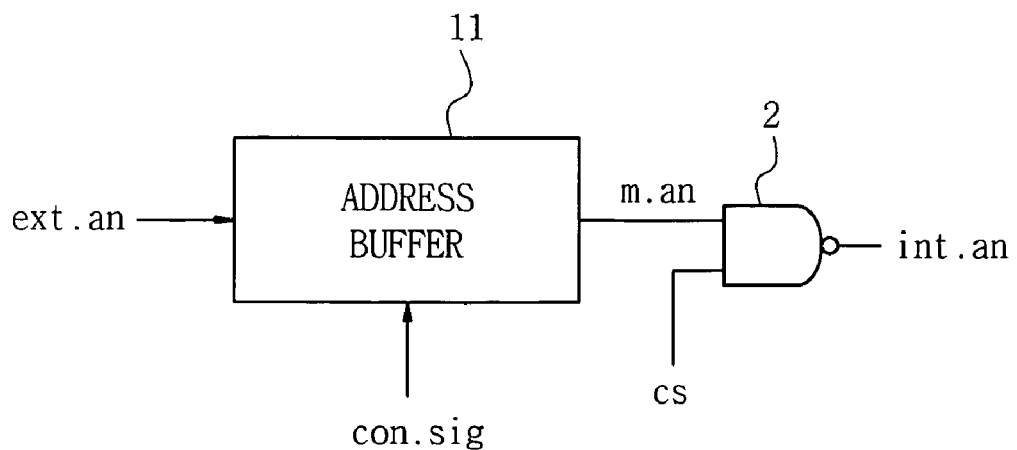
FIG. 2 is a schematic diagram of a conventional address buffer circuit in which NAND operation is performed on a chip select signal and upon a buffered signal from an address buffer in FIG. 1.
Figure 3:
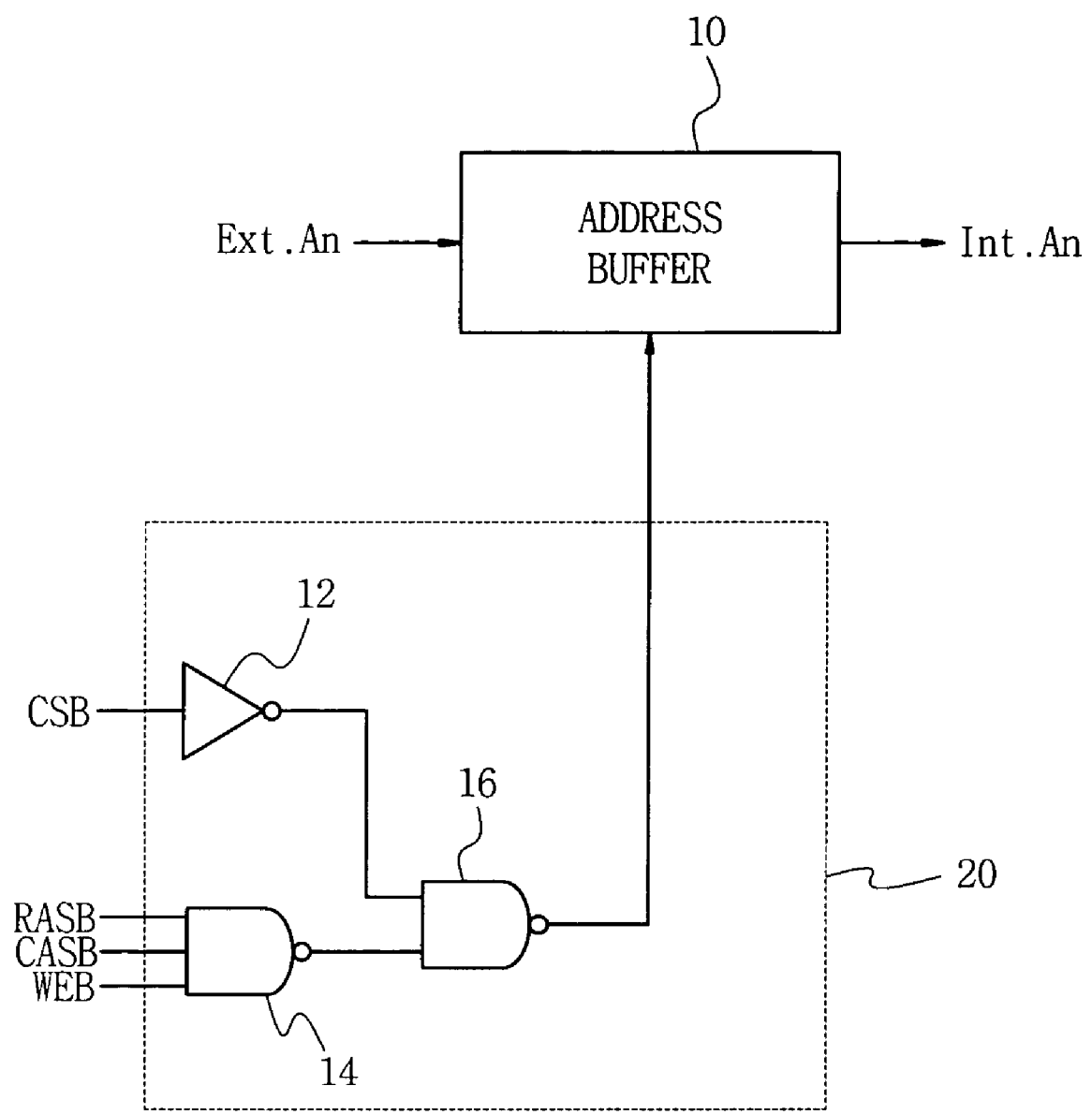
FIG. 3 is a schematic diagram of an address buffer circuit comprising an address buffer control unit according to an embodiment of the present invention.

FIG. 3 is a schematic diagram of an address buffer circuit comprising an address buffer control unit according to an embodiment of the present invention.

Referring to FIG. 3, there are shown an address buffer 10 that receives and buffers an external address signal and outputs an internal address signal, an external address signal (ext.an) input to the address buffer 10, an internal address signal (Int.an) buffered by and output from the address buffer 10, and an address buffer control unit 20 for controlling the address buffer 10. The address buffer control unit 20 shown in FIG. 3 consists essentially of a combinatorial logic circuit that combines memory control signals (e.g., RASB, CASB, WEB) and a chip select signal (CS). The address buffer control unit 20 includes an inverter 12, a first NAND-gate 14, and a second NAND-gate 16.

Memory control signals, including a chip select signal (CSB), a row address strobe (RASB), a column address strobe (CASB), a write enable signal (WEB) and the like, may be subject to logical combination (in the combinatorial logic circuit 20) to provide various commands to a (address buffer of the) semiconductor memory device.

The inverter 12 receives the chip select signal (CSB) and outputs an inverted version of the chip select signal (CS).

The first NAND-gate 14 receives memory control signals (RASB, CASB, WEB) and outputs the NAND operation result to the second NAND-gate 16. The memory control signals may be at least two of the row address strobe (RASB), the column address strobe (CASB), and the write enable signal (WEB). The first NAND-gate 14 may be composed of an AND-gate and an inverter. Alternatively, the first NAND-gate 14 may be composed of a NOR gate, an inverter and the like. The second NAND-gate 16 receives the output signal from the inverter 12 and the output signal from the first NAND-gate 14 to output a NAND operation result. The output signal (NAND operation result) from the second NAND-gate 16 is input to the address buffer 10 to control the address buffer 10.

The result of the NAND operation performed by the second NAND-gate 16 serves as an address buffer control signal that has a first level during the execution of an operation command (e.g., RASB, CASB, WEB) (in which the semiconductor memory device performs a data accessing operation), and a second level during a 'no operation' command (during which the semiconductor memory device does not perform a data accessing operation).

The operation of the address buffer control unit 20 is further described with reference to Logic Table 1.

TABLE 1

| CSB | RASB | CASB | WEB | First NAND operation result | Second NAND operation result |
|---|---|---|---|---|---|
| 0 | 1 | 1 | 1 | 0 | 1 |
| 1 | X | X | X | X | 1 |

In Logic Table 1, "0" and "1" indicate logic values, and 'X' indicates a Don't Care state in which it does not matter whether its logic value is "0" or "1".

When 'no operation' is detected and no command is provided to memory cells, the address buffer 10 should be disabled to conserve energy. As shown in Table 1, even when the chip select signal (CSB) has logic value 0 (indicating that the chip is selected to perform an operation), but the row address strobe (RASB) is 1, and the column address strobe (CASB) is 1, and the write enable signal (WEB) is 1, then the NAND operation result value from the first NAND-gate 14 becomes 0 and the NAND operation result value from the second NAND-gate 16 becomes 1, such that the address buffer 10 is disabled.

When the chip select signal (CSB) has logic value 1 (indicating the chip is not selected to perform an operation), the NAND operation result value from the second NAND-gate 16 becomes 1 (e.g., irrespective of the NAND operation result value of the first NAND-gate 14), such that the address buffer 10 is disabled. Thus, the internal address signal (int.an) that is the output of the address buffer is disabled during the no operation command, achieving power consumption reduction in the semiconductor memory device.

Figure 4:
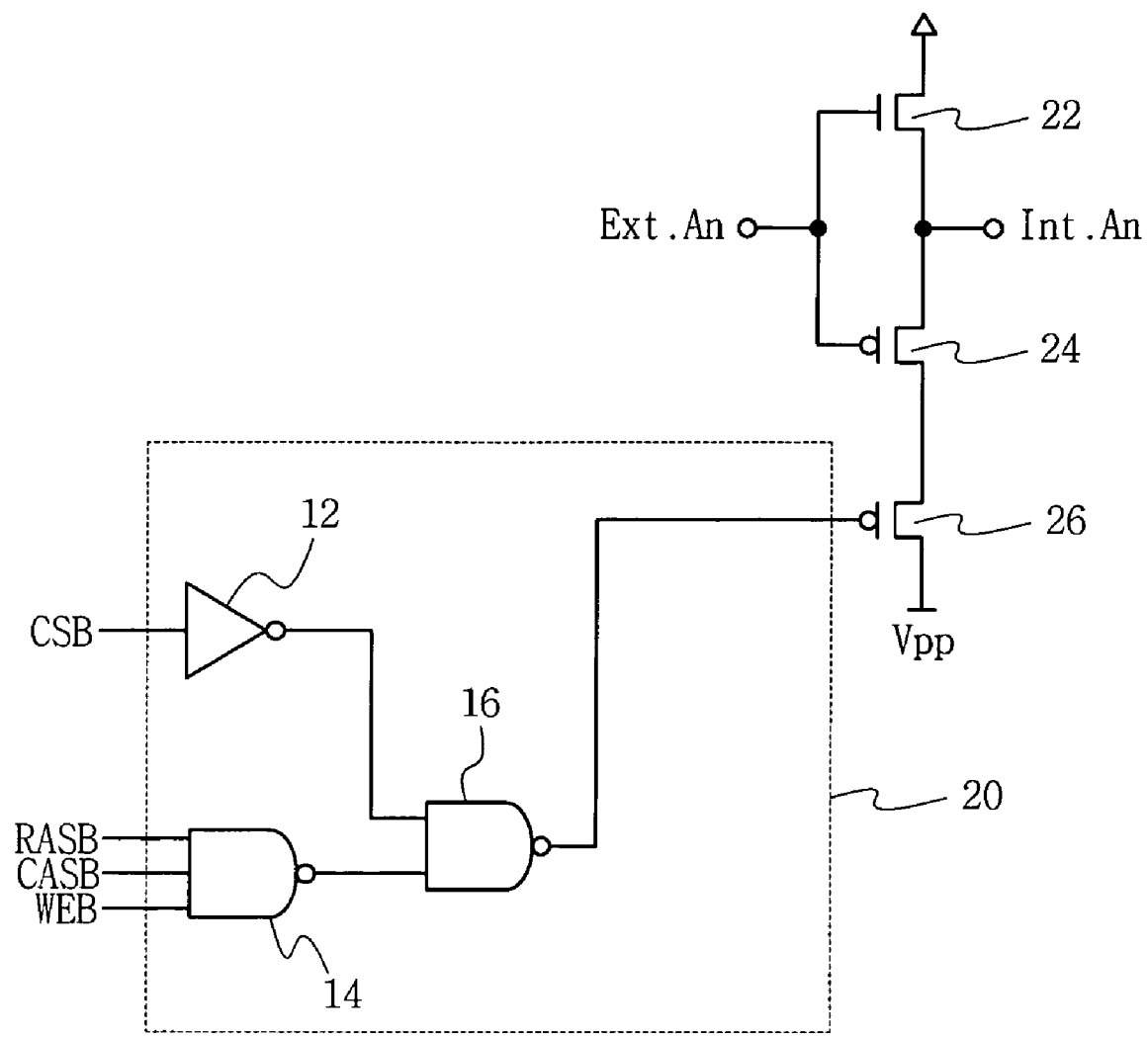
FIG. 4 is a circuit diagram schematically illustrating an example of an address buffer circuit comprising the address buffer control unit in FIG. 3.

FIG. 4 is a circuit diagram schematically illustrating an address buffer circuit comprising the address buffer control unit of FIG. 3.

The address buffer circuit of FIG. 4 includes: an address buffer consisting of CMOS transistors forming an inverter (an NMOS transistor 22 and a PMOS transistor 24), and an access (gating) transistor 26 connected between a power supply voltage Vpp and the inverter (PMOS transistor 24); and an address buffer control unit 20 connected to the gate of the access (gating) transistor 26.

Referring to Table 1 and FIG. 4, a process will be described that controls the address buffer using the address buffer control unit 20 in a 'no operation' command/state of the semiconductor memory device.

When the semiconductor memory device enters the 'no operation' command/state in response to the memory control signal, (i.e., the output of the second NAND-gate 16 becomes '1'), the access transistor 26 is turned OFF and the power supply voltage Vpp is not supplied to the inverter (e.g., to P-CMOS transistor 24). At this time, if the external address signal (ext.an) is 0, the internal address signal (int.an) is not output. Thus, the address buffer control unit 20 disables the address buffer when the memory control signals direct the memory device to the 'no operation' command/state as in Table 1. Accordingly, there is no power consumption in the address buffer in the 'no operation' command/state.

Figure 5:
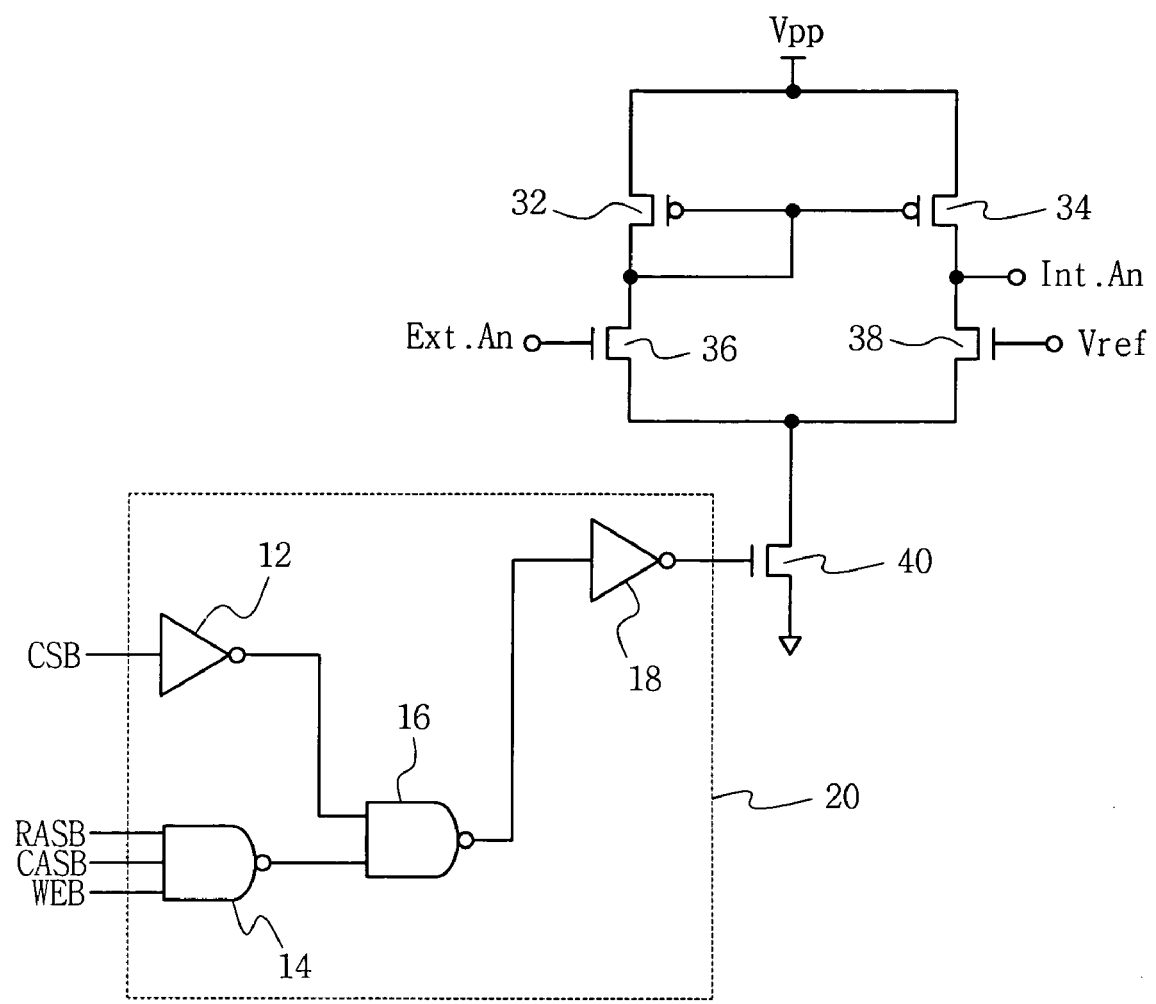
FIG. 5 is a circuit diagram schematically illustrating another example of an address buffer circuit comprising the address buffer control unit in FIG. 3.

FIG. 5 is a circuit diagram schematically illustrating another example of the address buffer circuit comprising the address buffer control unit in FIG. 3.

Referring to FIG. 5, an address buffer circuit may include an address buffer consisting essentially of a (gated) differential amplifier that is enabled and disabled by a control signal from an address buffer control unit 20.

The differential amplifier (address buffer) has a current mirror configuration and is composed of two (complementary) pairs of NMOS transistors and PMOS transistors, in which an external address signal (ext.an) is input to the gate electrode of the NMOS transistor 36. A voltage difference between the external address signal (ext.an) and a reference voltage (Vref), which is input to the gate electrode of the other NMOS transistor 38, is buffered and output as an internal address signal (int.an).

A process of controlling an address buffer in an address buffer control unit will be described with reference to Table 1 and FIG. 5.

In the no-operation state, (e.g., when none of commands RASB, CASB, and WEB are asserted, Low), the second NAND-gate 16 in the address buffer control unit 20 outputs '1', the inverter 18 inverts it to output to a '0'. Accordingly, the access transistor 40 is turned OFF and the differential amplifier does not operate, such that the internal address signal (int.an) is not buffered nor output. Thus, the address buffer control unit disables the address buffer when the memory control signals for controlling the semiconductor memory device have the logical states directing the memory device to the no-operation state, as in Table 1. Accordingly, there is no power consumption in the address buffer in the 'no operation' command/state.

Figure 6:
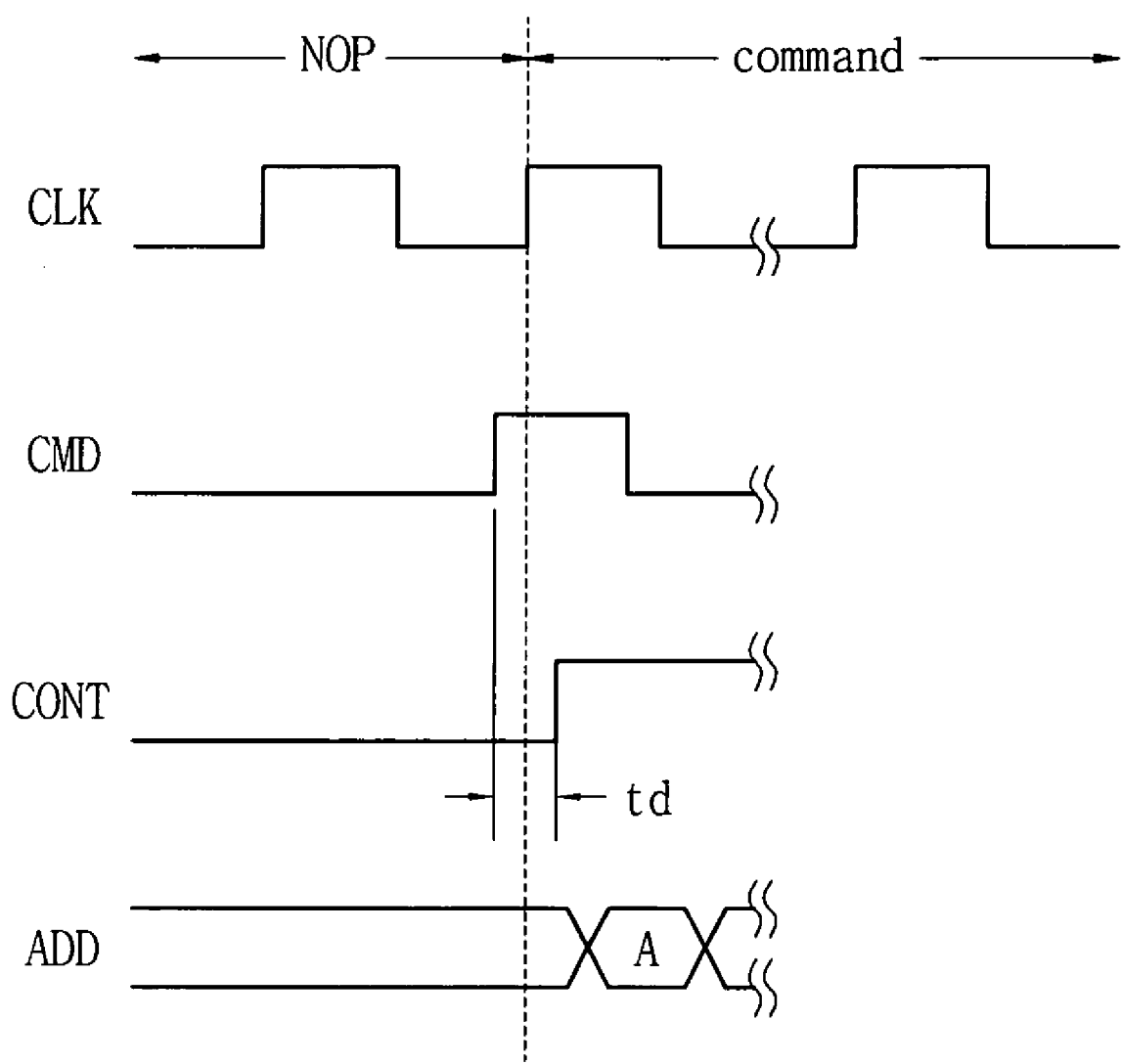
FIG. 6 is a timing diagram illustrating the case where a command signal and an address signal are input to a semiconductor memory device at different times according to an embodiment of the present invention.
Figure 7A:
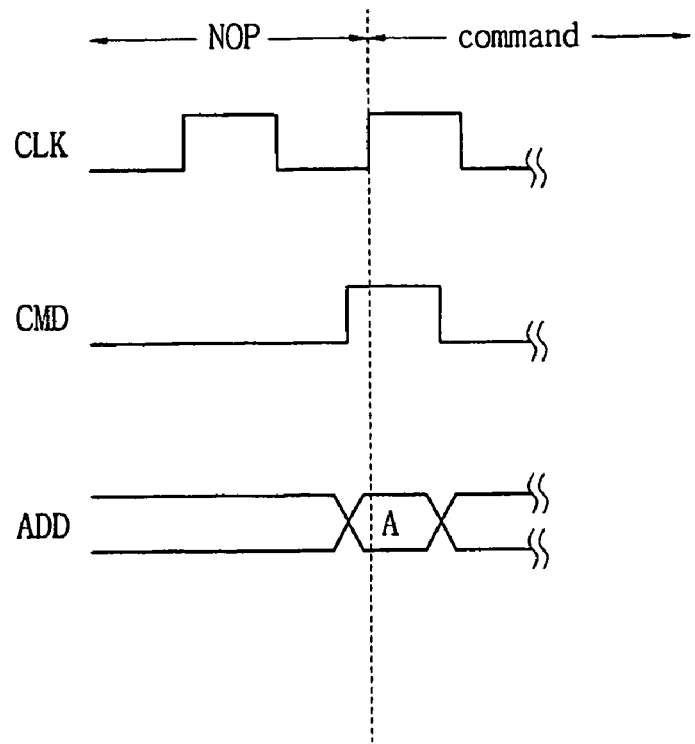
FIG. 7a is a timing diagram in the case where a command signal and an address signal are input at substantially the same time according to an embodiment of the present invention.
Figure 7B:
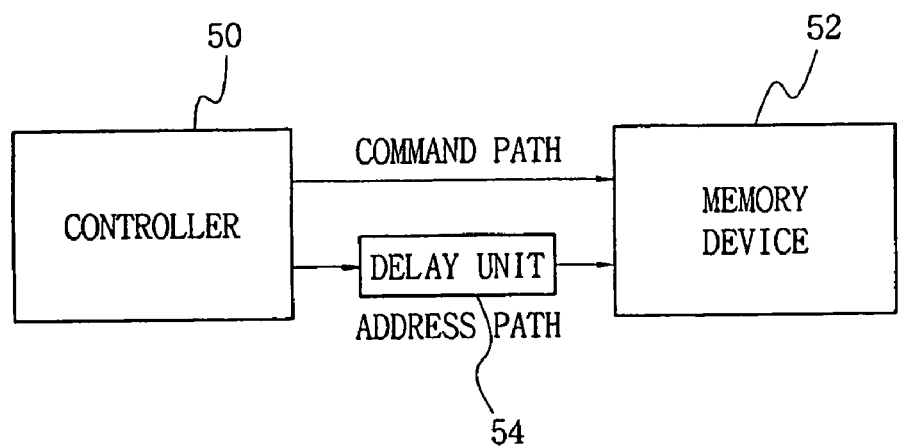
FIG. 7b is a block diagram illustrating a delay unit provided to adjust the timing of the control signal in the circuit of FIG. 5.

FIGS. 6, 7a are timing diagrams and FIG. 7b is a block diagram, illustrating exemplary operation of the address buffer circuit according to embodiments of the invention.

FIG. 6 is a timing diagram Illustrating the case where a command signal (e.g., RAS, CAS, or WE) and an address signal (A) are input to a semiconductor memory device at different moments in time.

In timing diagram FIG. 6, a 'no operation' state (NOP command state) is first illustrated (e.g., by command signal CONT at a Low level) and next a period during which an access of memory cells is performed is illustrated. Shown in FIG. 6, are: a clock signal CLK, a command signal (CMD), a control signal (CONT e.g., the output of inverter 18 of FIG. 5) having a first level, and an address signal (ADD) (where, "A" indicates an arbitrary address signal); and "td" indicates a delay time generated as the active (high) command signal (CMD) propagates through the address buffer control unit 20.

A control process in the address buffer control unit (20 of FIG. 3) will be described with reference to FIGS. 3 and 6. The external address signal (ext.an) is input later than the timing of a normal external address signal, so that it is input to the address buffer 10 at a time point when the (address buffer) control signal CONT has a first (voltage) level. Thus, the external address signal (ext.an) is input at a time point when the (address buffer) control signal (CONT) having the first (voltage) level is generated, so that access to a desired memory cell can be performed. Here, the external address signal (ext.an) may be input to the address buffer 10 later than the time when the control signal in the first level is generated.

FIG. 7a is a timing diagram illustrating the case where inputs to an address buffer, such as a command signal (e.g., RAS, CAS, or WE) and an address signal (A), are substantially simultaneous, such that the address buffer control signal (CONT e.g., the output of inverter 18 of FIG. 5) and the address signal (A) are input to the address buffer of a semiconductor memory device at substantially the same time.

FIG. 7a is a timing diagram illustrating the case where a command signal (CMD) and an address signal (A) are input at substantially the same time, i.e., illustrating a typical input timing of a command signal and an address signal.

FIG. 7b is a block diagram illustrating the case where a control signal CONT (e.g., the output of inverter 18 of FIG. 5) is delayed relative to the input of a command signal (e.g., RASB, CASB, or WEB) by a certain time (e.g., delayed by a delay unit on a address signal path).

FIG. 7b shows an input controller 50, a semiconductor memory device 52, and a delay unit 54, which are components configured to handle the case where a command signal and an address signal have the relative timing property shown in FIG. 7a are input.

The address buffer 10 (see FIG. 3) outputs the external applied address signal (ext.an) as the internal buffered address signal (int.an) in response to the first level of the control signal generated by the address buffer control unit 20. The address buffer 10 is disabled in response to the second level of the control signal.

The address buffer control unit 20 generates an control signal in the second (voltage) level in the 'no operation' state during which the semiconductor memory device 52 does not perform any data accessing operation, and generates the control signal in the first (voltage) level in the command state in which the semiconductor memory device 52 performs a data accessing operation.

The delay unit 54 is connected to the address buffer 10 for allowing the external address signal (ext.an) to be input to the address buffer 10 at a time point when the control signal in the first level is generated. Thus, by after the memory control signals are input to the address buffer control unit 20, a first control signal is input to the address buffer 10, so that the first control signal is delayed. Also, when the external address signal (ext.an) is input to the address buffer 10, accessing a desired memory cell requires adjustment for the delay of the first control signal. Thus, the external address signal (ext.an) is input to the address buffer 10 at the same time that the first control signal is generated. In this case, the external address signal (ext.an) may be input to the address buffer 10 later than the time when the control signal in the first level is generated. Further, the delay unit 54 may be present on an address path since it is positioned at a previous stage of the address buffer 10. Accordingly, the delay unit 54 may be positioned in the controller 50, on a memory module having the semiconductor memory device, or on an external address path in the semiconductor memory device.

As described above, with embodiments of the present invention, it is possible to reduce the power consumption of a semiconductor memory device by disabling the address buffer in the 'no operation' command/state and to reduce power consumption while performing normal (memory access) operations of the semiconductor memory device.

As described above, according to the present invention, it is possible to reduce power consumption in an address buffer by providing an address buffer control unit to disable the address buffer (e.g., by disconnecting the address buffer from the power supply voltage).

Further, with embodiments of the present invention, an address buffer circuit having an address buffer control unit is provided to a semiconductor memory device, thereby reducing or minimizing the output of an internal address buffered and output by the address buffer in a 'no operation' state during which access to memory cells using memory control signals is not performed.

The invention has been described with reference to preferred exemplary embodiments. However, it is to be understood that the scope of the invention is not limited to the disclosed embodiments. The scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. An address buffer circuit for a semiconductor memory device, comprising:
an address buffer for receiving and buffering an external address signal and for outputting an internal address signal;
an address buffer control unit including a combinatorial logic circuit configured to logically combine a row address strobe (RASB), a column address strobe (CASB), a write enable signal (WEB); and
a chip select signal (CSB) to generate a control signal for controlling the address buffer, wherein the address buffer is enabled if and only while the control signal is at a first level and is disabled if and while the control signal is at a second level, and wherein the address buffer is enabled if and only while the chip select signal (CSB) is at an active level.

2. The circuit according to claim 1, wherein the address buffer control unit generates the control signal at the second level if and only while a chip select signal (CSB) is at a high level.

3. The circuit according to claim 1, wherein the address buffer circuit includes an inverter for inverting the external address signal, wherein the inverter is connected in series to a control switch and between a power supply voltage and a ground voltage, and wherein the inverter is enabled in response to the first level of the control signal applied to the control switch.

4. The circuit according to claim 1, wherein the address buffer circuit includes a current mirror for mirroring the external address signal, wherein the current mirror is connected in series to a control switch and between a power supply voltage and a ground voltage, and wherein the current mirror is enabled in response to a first level of the control signal applied to the control switch.

5. An address buffer circuit for a semiconductor memory device, comprising:
a combinatorial logic circuit configured to logically combine a row address strobe (RASB), a column address strobe (CASB), and a write enable signal (WEB), and a chip select signal (CSB) to generate a control signal; and
an address buffer configured to receive an external address signal, wherein the address buffer is adapted to output an internal address signal if and only while the control signal is at a first level, wherein the operation of the address buffer is disabled while the control signal is at a second level,
wherein the combinatorial logic circuit generates the control signal at the first level if and only while the chip select signal (CSB) is at an active level.

6. The circuit according to claim 5, wherein the control signal is generated at the second level in a 'no operation' state.

7. The circuit according to claim 5, wherein the control signal is generated at the second level while the semiconductor memory device does not perform a data accessing operation, and the control signal is generated at the first level while the semiconductor memory device performs a data accessing operation.

8. The circuit according to claim 5, wherein the control signal is generated at the second level when a chip select signal (CSB) is at a high level.

9. The circuit according to claim 5, further comprising a delay unit connected to a previous stage of the address buffer for allowing the external address signal to be input to the address buffer at the same time that the control signal is generated at the first level.

10. The circuit according to claim 9, wherein the delay unit is operatively connected in an external address signal line into the address buffer in the semiconductor memory device.

11. The circuit according to claim 9, wherein the delay unit causes the external address signal to be input to the address buffer later than or concurrently with the generation of the control signal at the first level.

12. A method for controlling an address buffer configured to receive an external address signal, the method comprising:
logically combining a chip select signal (CSB), a row address strobe (RASB), a column address strobe (CASB) and a write enable signal (WEB) to generate a control signal;
applying the control signal to the address buffer;
outputting an internal address signal based on the external address signal if and only while the control signal is at a first level;
disabling the address buffer if and while the control signal is at a second level; and
enabling the address buffer if and only while the chip select signal (CSB) is at an active level.

13. The method according to claim 12, further comprising delaying the external address signal so that the external address signal is input to the address buffer at the same time that the control signal is generated at the first level.

14. The method according to claim 13, wherein the delayed external address signal is input to the address buffer later than or concurrently with the control signal at the first level.

15. The method according to claim 12, wherein the control signal at the first level and the control signal at the second level are generated only by combining memory control signals CSB, RASB, CASB and WEB.

16. The method according to claim 12, wherein the address buffer includes an inverter for inverting the external address signal and wherein the inverter is connected in series to a control switch and between a power supply voltage and a ground voltage;
and further comprising enabling the inverter in response to the first level of the control signal applied to the control switch.

17. The method according to claim 12, wherein the address buffer circuit includes a current mirror for mirroring the external address signal and wherein the current mirror is connected in series to a control switch and between a power supply voltage and a ground voltage;
and further comprising enabling the inverter in response to a first level of the control signal applied to the control switch.

18. The circuit according to claim 12, wherein the address buffer circuit includes a current mirror for mirroring the external address signal, wherein the current mirror is connected in series to a control switch and between a power supply voltage and a ground voltage, and wherein the current mirror is enabled in response to a first level of the control signal applied to the control switch.

* * * * *